United States Patent
Tsuji et al.

(10) Patent No.: US 7,042,102 B2
(45) Date of Patent: May 9, 2006

(54) SEMICONDUCTOR DEVICE

(75) Inventors: Kazuto Tsuji, Kawasaki (JP);
Yoshihiro Kubota, Kawasaki (JP);
Kenji Asada, Kawasaki (JP);
Sumikazu Hosoyamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/971,692

(22) Filed: Oct. 25, 2004

(65) Prior Publication Data

US 2005/0269701 A1    Dec. 8, 2005

(30) Foreign Application Priority Data

Jun. 2, 2004    (JP) ............................ 2004-164858

(51) Int. Cl.
*H01L 23/48*    (2006.01)
*H01L 29/40*    (2006.01)

(52) U.S. Cl. .................. 257/780; 257/781; 257/782; 257/784; 257/775

(58) Field of Classification Search ............... 257/780, 257/781, 782, 784, 786, 691, 775
See application file for complete search history.

(56) References Cited

U.S. PATENT DOCUMENTS 5,294,897 A * 3/1994 Notani et al. ................ 333/33
5,521,431 A * 5/1996 Tahara ........................ 257/676
6,049,126 A * 4/2000 Saitoh ......................... 257/728
RE37,081 E * 3/2001 Eriksen ...................... 15/327.5

FOREIGN PATENT DOCUMENTS

| JP | 6-6151 | 1/1994 |
| JP | 10-178321 | 6/1998 |
| JP | 10-242190 | 9/1998 |

* cited by examiner

*Primary Examiner*—Jasmine Clark
(74) *Attorney, Agent, or Firm*—Westerman, Hattori, Daniels & Adrian, LLP

(57) ABSTRACT

In a semiconductor device, bonding-wires can be applied parallel to each other to electrodes of high-speed signal lines when mounting a highly densified semiconductor element on a low-cost substrate while reducing a length of the bonding-wires. An impedance-matched substrate having wiring that impedance-matched with circuits of a semiconductor element is mounted on a substrate. A plurality of first metal wires connect between first electrodes of the semiconductor element and electrodes of the substrate. A plurality of second metal wires connect between second electrodes of the semiconductor element and first electrodes of the impedance-matched substrate. A plurality of third metal wires connect between second electrodes of the impedance-matched substrate and electrodes of the substrate. The second metal wires extend parallel to each other, and the third metal wires also extend parallel to each other.

15 Claims, 6 Drawing Sheets

SEMICONDUCTOR DEVICE

BACKGROUND OF THE INVENTION

1. Field of the Invention

The present invention relates to semiconductor devices and, more particularly, to a semiconductor device in which a semiconductor element is mounted on a substrate by wire-bonding.

2. Description of the Related Art

In recent years, high-densification of semiconductor element has progressed, which causes a reduction in a pitch of electrode terminals formed on an semiconductor element. Additionally, a processing speed of input and output signals has been increased, which results in, in many cases, provision of electrode terminals for inputting and outputting high-frequency signals.

High-frequency signal lines connected to the electrode terminals for outputting and inputting high frequency signals need to take impedance-matching with peripheral circuits and wirings. Generally, a differential pair is formed by two high-frequency lines, and the differential pair is located between shielding lines such as a grounding line, a power supply line, etc.

Generally, in a semiconductor device, electrodes of a semiconductor element are arranged along a periphery (each side) of the semiconductor element, and the semiconductor element is mounted on a substrate and electrically connected to the substrate by bonding wires. The thus-constructed semiconductor device can be manufactured using a previously-established technology, and, thus, can be manufactured at a relatively low-cost.

For example, Japanese Laid-Open Patent Application No. 6-6151 discloses a semiconductor device having the above-mentioned structure.

If a high-densification technique like a semiconductor element fabricating-technique is used for manufacturing a substrate on which a semiconductor element is mounted, a manufacturing cost of the substrate is increased. For this reason, generally, a substrate is manufactured using a technique to manufacture a low-density structure as compared to that of a semiconductor element. Such a substrate is referred to as a low-cost substrate.

It is difficult to form high-density wiring on the low-cost substrate, which increases an area (size) of a substrate. However, since the cost of a semiconductor device can be reduced by using the low-cost substrate, the low-cost substrate is used widely. With high-densification of semiconductor elements, a pitch of electrodes of semiconductor elements has become much smaller than a pitch of terminals of the low-cost substrate.

Therefore, in a case where electrodes arranged in a peripheral part of a semiconductor element are wire-bonded to terminals of a substrate, the wire-bonding is performed on the terminals of the substrate while gradually increasing an interval of the adjacent bonding-wires.

Additionally, the terminals of the substrate are caused to apart away from the semiconductor element, which results in an increase in a length of each bonding-wire.

If such a highly densified semiconductor element is mounted on the low-cost substrate, the bonding-wires are not parallel to each other but gradually spread. Especially, in a case in which high-speed signal lines are constituted by differential pairs, a length of bonding-wires is increased, which may result in a case where an appropriate impedance, for example, 100 Ω, cannot be provided.

Additionally, since the bonding-wires are elongated, there is a problem that it is difficult to take impedance-matching of bonding-wires with wiring formed in the low-cost substrate. Although impedance-matching can also be achieved within the substrate by forming wiring in the substrate with a fine structure, it is not preferable to form a fine structure only in a part of the low-cost substrate.

SUMMARY OF THE INVENTION

It is a general object of the present invention to provide an improved and useful semiconductor device in which the above-mentioned problems are eliminated.

A more specific object of the present invention is to provide a semiconductor device in which bonding-wires can be applied parallel to each other to electrodes of high-speed signal lines when mounting a highly densified semiconductor element on a low-cost substrate while reducing a length of the bonding-wires.

In order to achieve the above-mentioned objects, there is provided according to the present invention a semiconductor device comprising: a substrate; a semiconductor element mounted on the substrate; an impedance-matched substrate having wiring that impedance-matched with circuits of the semiconductor element; a plurality of first metal wires connecting between first electrodes of the semiconductor element and electrodes of the substrate; a plurality of second metal wires connecting between second electrodes of the semiconductor element and first electrodes of the impedance-matched substrate; and a plurality of third metal wires connecting between second electrodes of the impedance-matched substrate and electrodes of the substrate, wherein the second metal wires extend parallel to each other, and the third metal wires also extend parallel to each other.

In the semiconductor device according to the present invention, a pitch of the second electrodes of the impedance-matched substrate may be greater than a pitch of the first electrodes of the impedance-matched substrate. A pitch of the first electrodes of the impedance-matched substrate may be equal to a pitch of the second electrodes of the semiconductor element. A distance between adjacent ones of the first metal wires extending from the first electrodes of the semiconductor element to the electrodes of the substrate may gradually increase toward the electrodes of the substrate. A thickness of the impedance-matched substrate may be smaller than a thickness of the semiconductor element. A thickness of the impedance-matched substrate is substantially equal to one half of the thickness of the semiconductor element.

Additionally, in the semiconductor device according to the present invention, the impedance-matched substrate may have a notch at a position where the second electrodes are provided, and the third metal wires may be connected to the electrodes of the substrate by extending through an area surrounded by inner surfaces of the notch. The impedance-matched substrate may be formed of an electrically conductive material, and the inner surfaces of the notch may be defined by exposed surfaces of the electrically conductive material. The inner surfaces of the notch may be plated by an electrically conductive material.

Further, in the semiconductor device according to the present inventions, projection electrodes may be formed on the first electrodes of the impedance-matched substrate, and the second metal wires may be bonded to the projection electrodes. First sides of the second wires may be bonded to the second electrodes of the semiconductor elements, and second sides of the second metal wires may be bonded to the projection electrodes.

Additionally, in the semiconductor device according to the present invention, a part of the plurality of first metal wires may be connected to the electrodes of the substrate by extending above the impedance-matched substrate.

Further, in the semiconductor device according to the present invention, shield wirings or shield planes, which are to be at a power supply potential or a grounding potential, may be provided on both sides of the impedance-matched wirings of the impedance-matched substrate. The impedance-matched substrate may be formed of an electrically conductive material, and the shield wirings or the shield planes may be formed as a part of the impedance-matched substrate.

Further, in the semiconductor device according to the present invention, the impedance-matched substrate may have a triangular shape, and a side of the triangular shape may be positioned to be adjacent to and parallel to a side of the semiconductor element.

According to the above-mentioned invention, the wiring path which requires impedance-matching is formed on the impedance-matched substrate so as to acquire impedance matching with high accuracy, while impedance matching with comparatively low accuracy is applied to other wiring paths. Accordingly, when mounting the semiconductor element having a fine pitch, a substrate having a relatively rough substrate structure is used and the impedance-matched substrate is used only for high-speed line requiring impedance matching, and, thereby, there is no need to make the entire substrate with a fine structure. Therefore, even when mounting a semiconductor element having a fine electrode pitch, a relatively inexpensive substrate can be used, which reduces a manufacturing cost of the semiconductor device.

Other objects, features and advantages of the present invention will become more apparent from the following detailed description when read in conjunction with the accompanied drawings.

DETAILED DESCRIPTION OF THE PREFERRED EMBODIMENTS

Figure 1:
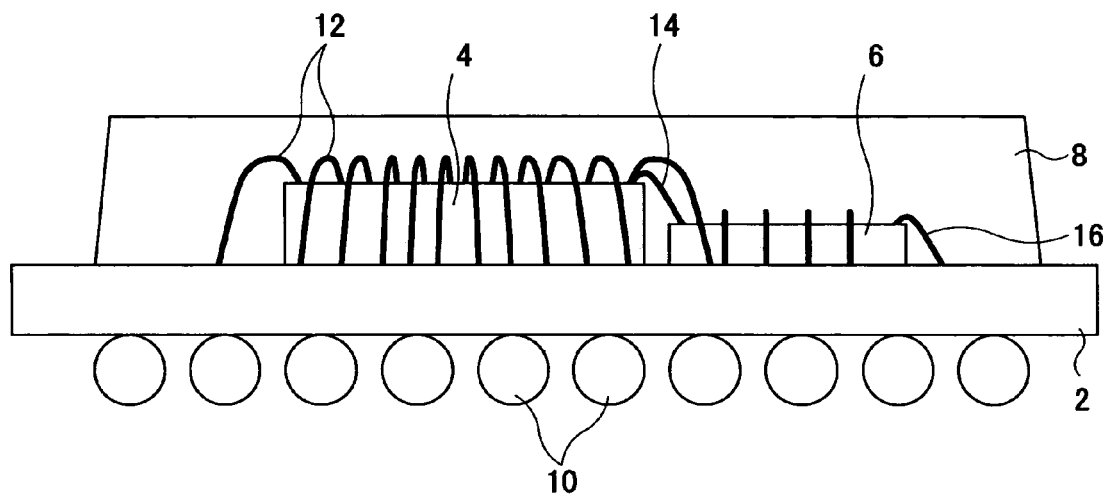
FIG. 1 is a see-through side view of a BGA-type semiconductor device according to a first embodiment of the present invention.
Figure 2:
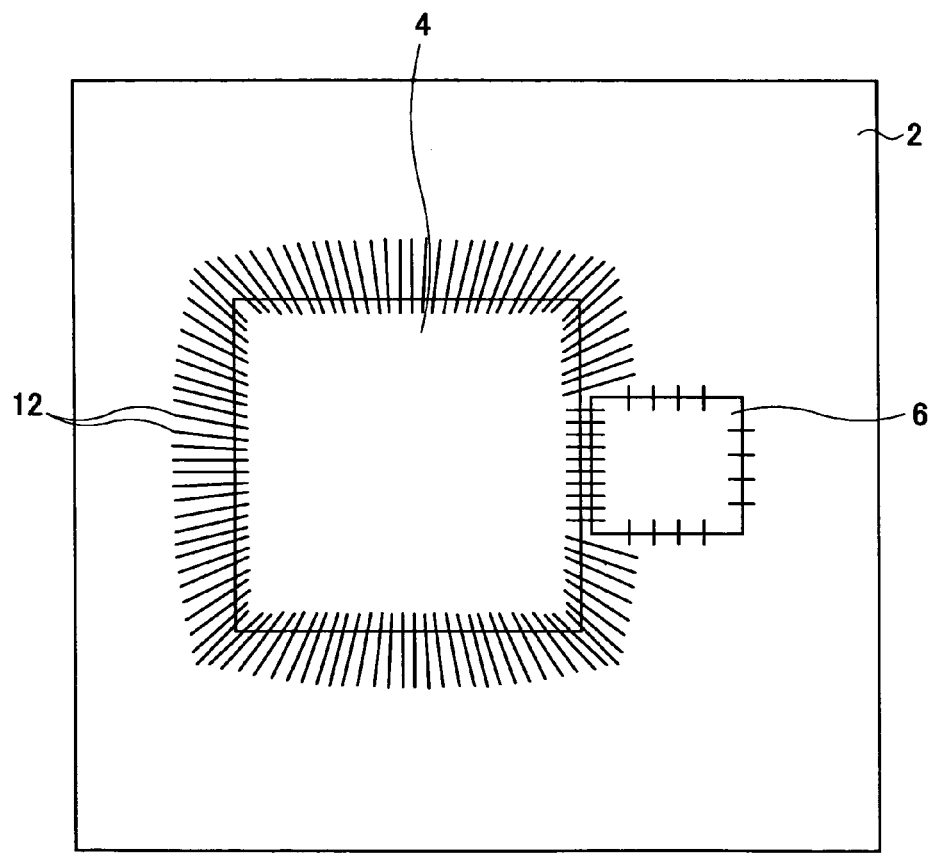
FIG. 2 is a see-through plan view of the semiconductor device shown in FIG. 1.
Figure 3:
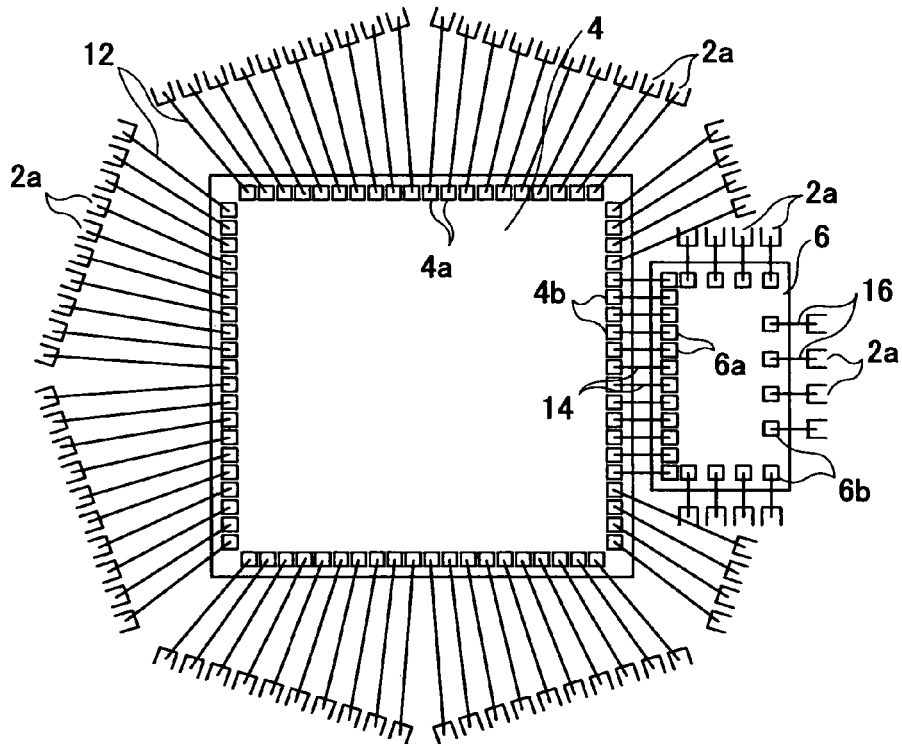
FIG. 3 is a plan view of an interior of the semiconductor device shown in FIG. 1 showing a method of applying bonding wires.

A description will now be given, with reference to FIGS. 1 through 3, of a semiconductor device according to a first embodiment of the present invention. FIG. 1 is an internal a see-through side view of a ball-grid array (BGA) type semiconductor device according to the first embodiment of the present invention. FIG. 2 is a see-through plan of the semiconductor device shown in FIG. 1. FIG. 3 is a plan view showing a structure of bonding-wires in the semiconductor device shown in FIG. 1.

The semiconductor device according to the first embodiment of the present invention comprises a substrate 2, a semiconductor element 4 mounted on the substrate 2 and an impedance-matched substrate 6 mounted on the substrate 2. The semiconductor element 4 and the impedance-matched substrate 6 are wire-bonded to electrodes 2a (refer to FIG. 3) of the substrate 2, and those are entirely encapsulated by a seal resin 8 on the substrate 2. Provided on the backside of the substrate 2 are solder balls 10 which serve as external connection terminals.

Electrodes (first electrodes) 4a are arranged along four sides of the semiconductor element 4, and a pitch of the electrodes 4a is a fine pitch. On the other hand, the substrate 2 is a low-cost substrate, and a pitch of the electrodes is larger than the electrode pitch of the semiconductor element 4. Therefore, a distance between adjacent wires among the bonding-wires (first metal wires) 12 that connect the electrode 4a of a semiconductor element 4 to the electrodes 2a of the substrate 2 gradually increases from the semiconductor 4 side to the substrate 2 side, as shown in FIG. 2.

The semiconductor device 4 has electrodes (second electrodes) 4b corresponding to, for example, high-speed signal lines in addition to the electrodes (first electrodes) 4a connected to the electrode 2a of the substrate 2 by the bonding-wires 12. The electrodes 4b are connected to electrodes 6b formed on the impedance-matched substrate 6 through bonding-wires (second metal wires) 14. Especially, an impedance of the high-speed signal line needs to be adjusted with respect to a path between the internal wiring of the semiconductor element 4 to the wiring of the substrate 2. When the high-speed lines are achieved according to the connection by the bonding-wires 12, it is difficult to achieve an appropriate impedance (for example 100 Ω) since the bonding-wires 12 are long. Thus, in the present embodiment, wiring is previously formed in the impedance-matched substrate 6 so that a predetermined impedance is attained (refer to FIG. 4).

The impedance-matched substrate 6 is provided at a position close to a portion where the electrodes 4b corresponding to the high-speed lines 14 of the semiconductor element 4. That is, one side of the impedance-matched substrate 6 having a generally quadrilateral shape is positioned close to one side (side where the electrodes for high-speed signal lines are arranged) of the semiconductor element 4. The electrodes 4b corresponding to the high-speed signal lines of the semiconductor element 4 are connected to the electrodes (first electrodes) 6a of the impedance-matched substrate 6 by through he bonding wires 14.

The pitch of the electrode 6a of the impedance-matched substrate 6 connected by the bonding-wires 14 is set to be equal to the pitch of the electrodes 4b of the semiconductor element 4 so that the bonding wires 14 extend parallel to each other. Moreover, since the impedance-matched substrate 6 is positioned close to the semiconductor element 4, the bonding-wires 14 can be much shorter than the bonding-wires 12, which enables to minimize the impedance of the bonding-wires 12.

The electrodes 6a of the impedance-matched substrate 6, which align along the side facing the semiconductor element 4, is connected to the electrodes (second electrodes) 6b provided along other three sides of the impedance-matched substrate 6 through the wiring formed on the impedance-matched substrate 6. The electrodes 6b provided along other three sides of the impedance-matched substrate 6 are arranged at an electrode pitch equal to the pitch of the electrodes 2a of the substrate. Therefore, the electrodes 6b of the impedance-matched substrate 6 are connected to the electrodes 2a of the substrate 2 by bonding-wires (third metal wires) 16 parallel to each other.

Figure 4:
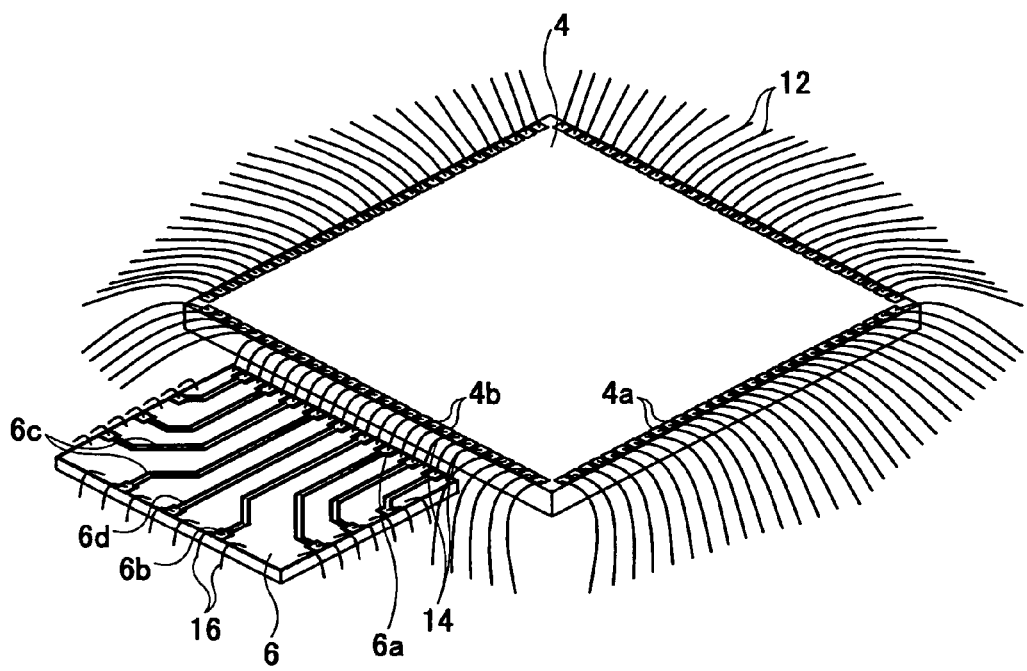
FIG. 4 is a perspective view of an impedance-matching substrate and a semiconductor substrate.

A description will now be given, with reference to FIG. 4, of the impedance-matched substrate 6. FIG. 4 is a perspective view of the impedance-matched substrate 6 and the semiconductor element 4, wherein wires 6c formed on the substrate are shown.

The impedance-matched substrate 6 can be any substrate made of a material such as an organic substrate, a glass substrate or a metal substrate if the substrate is thinner than the semiconductor element 4 and wiring can be formed thereon. In the present embodiment, a description will be given of a case where a copper substrate is used. When using a substrate formed of a conductive material such as a copper substrate, a portion of the substrate other than wirings can be at a power supply potential or a grounding potential. Moreover, when setting the copper substrate at a grounding potential, it is not necessary to provide especially electrodes for bonding-wires as grounding lines, and bonding wires can be directly bonded onto the substrate. Further, the electrodes formed on the impedance-matched substrate 6 can be formed as a part of the pattern wiring, and there is no need to separate the electrodes from the pattern wiring.

When forming the impedance-matched substrate 6 by the copper substrate, first, an insulating layer 6d, which is slightly larger than pattern wire 6c, is formed on the copper substrate, and, then, the pattern wire 6c is formed on the insulating layer 6d. An end (corresponding to the electrode 6a) of each pattern wire 6c is located near the side facing the semiconductor element 4, and an opposite end (corresponding to the electrode 6b) is located near other three sides.

Each pattern wire 6c is formed with predetermined length and width so as to have a desired impedance (for example, 100 Ω). The impedance of the pattern wire can be made smaller than an impedance of a bonding-wire, and can be set to a desired value with higher accuracy. Therefore, the electrode 4bs of the semiconductor element 4 are connectable with the electrode 2b of the substrate 2 through the impedance with accuracy higher than the bonding-wires 12. It should be noted that both the bonding-wires 14 and bonding wires 16 are sufficiently shorter than the bonding-wires 12, which gives less influence of impedance.

Moreover, the portion of the surface of the impedance-matched substrate 6 where no pattern wire is provided is set to a power supply potential or a grounding potential so as to serves as a shield wiring or a shield plane.

Moreover, as shown in FIG. 1, the thickness of the impedance-matched substrate 6 is preferably equal to or smaller than the thickness of the semiconductor element 4. This is because the sum total of the length of the bonding-wire 14 and the bonding-wire 16 becomes too large if the thickness of the impedance-matched substrate 6 is larger than the thickness of the semiconductor element 4. Moreover, it is more preferable that the thickness of the impedance-matched substrate 6 is one half of the thickness of the semiconductor element 4. In this case, differences in height between the bonding surfaces to which the bonding-wires 14 and the bonding-wires 16 are bonded (a difference in height between the surface of the semiconductor element and the surface of the impedance-matched substrate 6 and a difference in height between the surface of the impedance-matched substrate 6 and the surface of the substrate 2) become equal to each other, which provides an advantage in that the bonding can be performed by the same wire-bonding apparatus.

Figure 5:
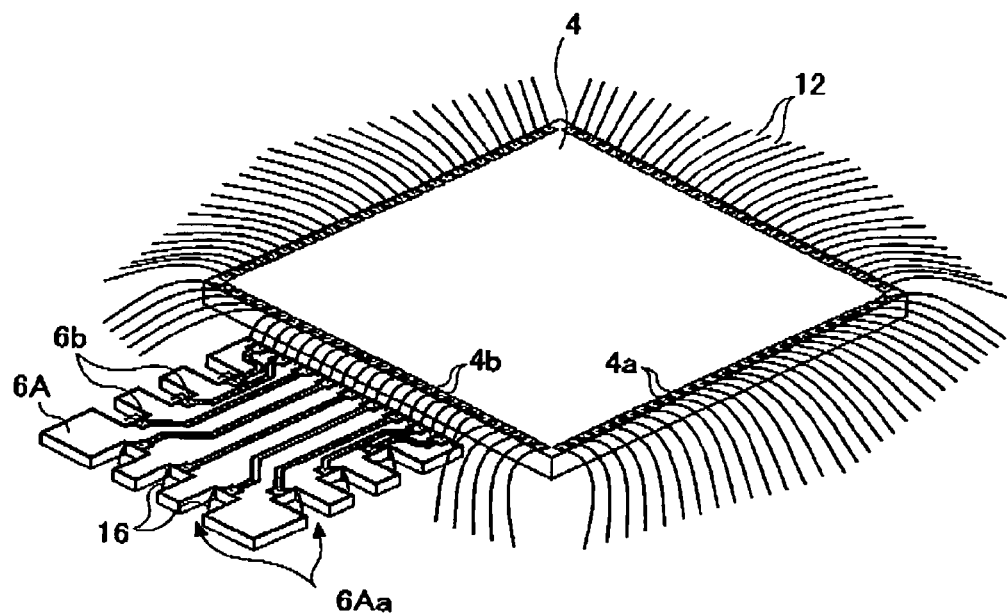
FIG. 5 is a perspective view of an impedance-matching substrate and a semiconductor substrate.

A description will now be given, with reference to FIG. 5, of a variation of the impedance-matched substrate 6. An impedance-matched substrate 6A shown in FIG. 5 is provided with notches 6Aa at portions where the electrodes 6b are provided. The surface of the substrate 2, which is exposed by the notches 6Aa, is provided with electrodes 2a (not shown in the figure), and the electrodes 6b are connected to the electrodes 2a. Therefore, the bonding-wires 16 extend on the inner side of the notches 6Aa.

The impedance-matched substrate 6A is a copper substrate, and the inner side of each notch 6Aa is surrounded by the copper surfaces in three directions, which is a state where the bonding wires 16 are shielded by the inner surfaces of each notch 6Aa. Therefore, a noise-reducing effect can be obtained by shielding the bonding wires 16 to which a noise tends to enter. When the impedance-matched-substrate 6A is formed of a material other than a conductive material like the copper substrate, the same shield effect can be acquired by plating a conductive material such as a copper plating on the inner surfaces of the notches.

A description will now be given of a preferred example of wire-bonding from the electrodes 4b of the semiconductor element 4 to the electrode 6a of the impedance-matched substrates 6 or 6A.

Figure 6:
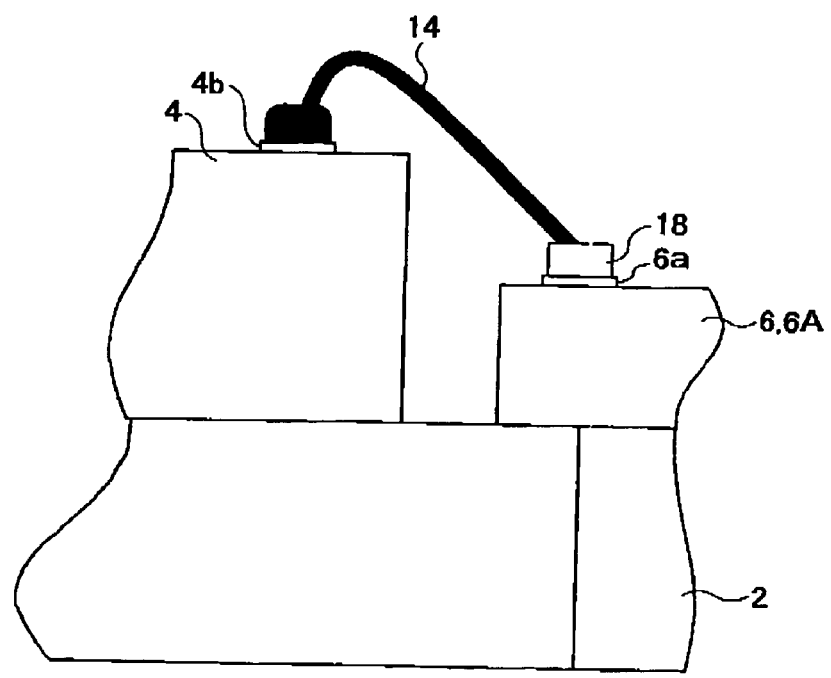
FIG. 6 is a side view of a part of the semiconductor device where a bonding-wire is applied between the semiconductor element and the impedance-matching substrate.

The bonding-wires 14 connect between the electrode 4b of the semiconductor element 4 and the electrode 6a of the impedance-matched substrates 6 or 6A. Generally, as a method of bonding, the electrodes 4b of the semiconductor element 4 are set as a primary side of bonding and the electrodes 6a of the impedance-matched substrates 6 or 6A, which are at a position lower than the electrodes 4a, are set as a secondary side of bonding. As shown in FIG. 6, on the primary side of bonding, a ball portion formed at the end of a wire is bonded. Since the size of the ball can be made smaller than the pitch of the electrodes 4b of the semiconductor element 4, the bonding portion on the primary side does not give influence to wire-bonding.

However, on the secondary side of bonding, the wire is pulled apart while being pressed against the electrode 6a. Thus, there is a possibility that the crushed wire spreads in left and right directions and extend to the adjacent electrodes 6a. That is, since a portion referred to as a fish tail is formed on the secondary side of bonding, the interval of the electrodes 6a must be increased in consideration of the fish tail. In the present embodiment, the pitch of the electrodes 6a of the impedance-matched substrates 6 or 6A is made equal to the pitch of the electrodes 4b of the semiconductor element 4 so as to cause the bonding-wires 14 parallel to each other, and there is no need to reduce the interval of the electrodes 6a. Thus, it is preferable to form a projection electrode 18 on each electrode 6a, as shown in FIG. 6, so that the fish tail does not protrude from a top surface of the projection electrode 18. The projection electrode 18 can be formed using, for example, a stud bump, a plating bump, etc.

Figure 7:
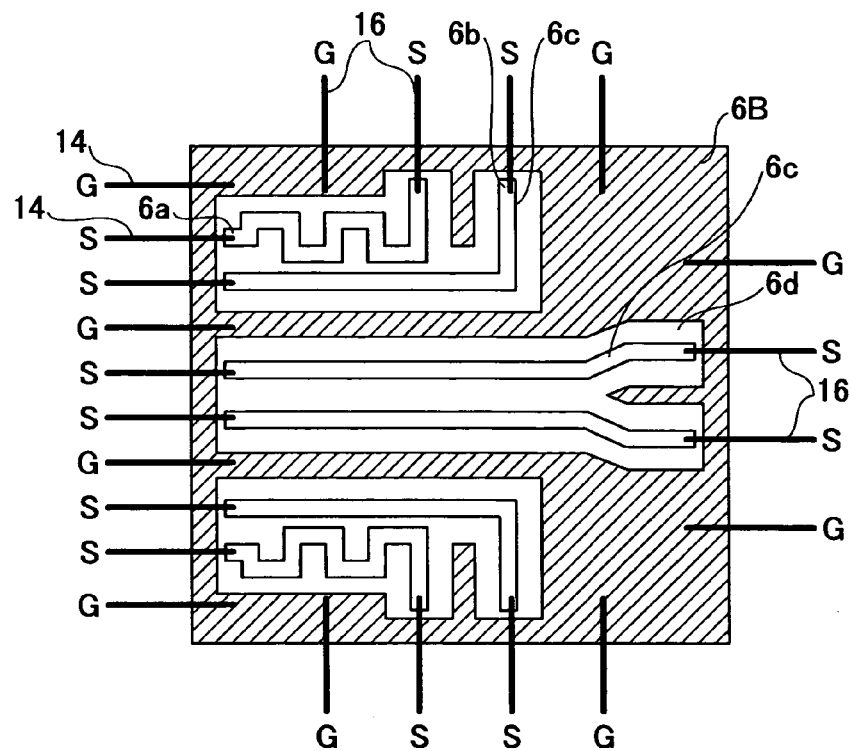
FIG. 7 is a plan view of an impedance-matching substrate provided with signal lined forming differential pairs.

A description will now be given of a case where the signal lines connected by the impedance-matched substrate 6 are differential pairs. FIG. 7 is a plan of an impedance-matched substrate 6B which is provided with signal wires serving as differential pairs. Although the impedance-matched substrate 6B has a fundamental structure the same as that of the impedance-matched substrate 6, each two pattern wires 6c are formed to make a pair and both the pattern wires 6c that make pair are formed with the same width and length. A pair of pattern wires 6c corresponds to signal wires, and the bonding-wires 14 and 16 connected to the pattern wires 6c are given a sign S. On the other hand, a sign G is given to the bonding-wires 14 and 16 used as grounding wiring.

As shown in FIG. 7, a pair of bonding-wires 14 and 16 (wires to which the sign S is given) connected to a pair of pattern wires 6c are interposed between the bonding-wires 14 and 16 that serve as grounding wires so as to be shielded by the bonding-wires 14 and 16. It should be noted that the copper substrate is used in the present embodiment, and, thus, electrodes for the bonding-wires 14 and 16 that serves as grounding wires are not provided, and the bonding-wires 14 and 16 serving as grounding wires are bonded directly to the copper substrate. Therefore, the copper substrate itself is set to a grounding potential.

It should be noted that, in FIG. 7, the winding pattern wire 6c in each of the upper and lower pairs of pattern wires is provided with the winding portion so that a length of the winding pattern wire 6c is equal to the other pattern wire 6c of the pair.

Figure 8:
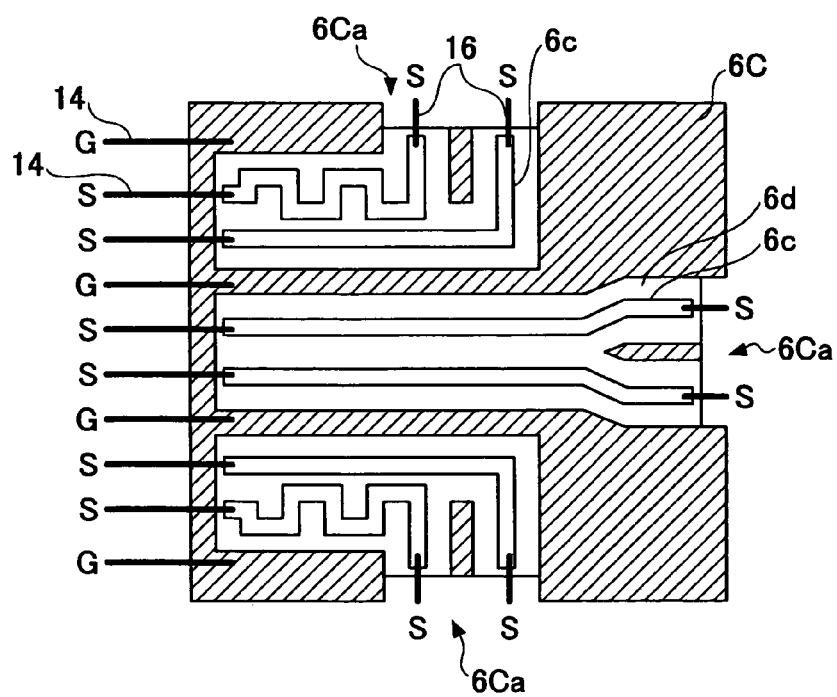
FIG. 8 is a plan view of an impedance-matching substrate provided with notches.

Notches shown in FIG. 5 may be provided to an impedance-matched substrate 6C shown in FIG. 7. FIG. 8 is a plan view showing the impedance-matched substrate 6C provided with notches 6Ca. The notches 6Ca provide the same effects as the notches 6Aa of the impedance-matched substrate 6A shown in FIG. 5. Moreover, the bonding-wires 16 for signal wiring (wires to which the sign S is given) are interposed between the inner surfaces of the notches 6Ca, and there is no need to provide the bonding-wires for grounding wiring.

Figure 9:
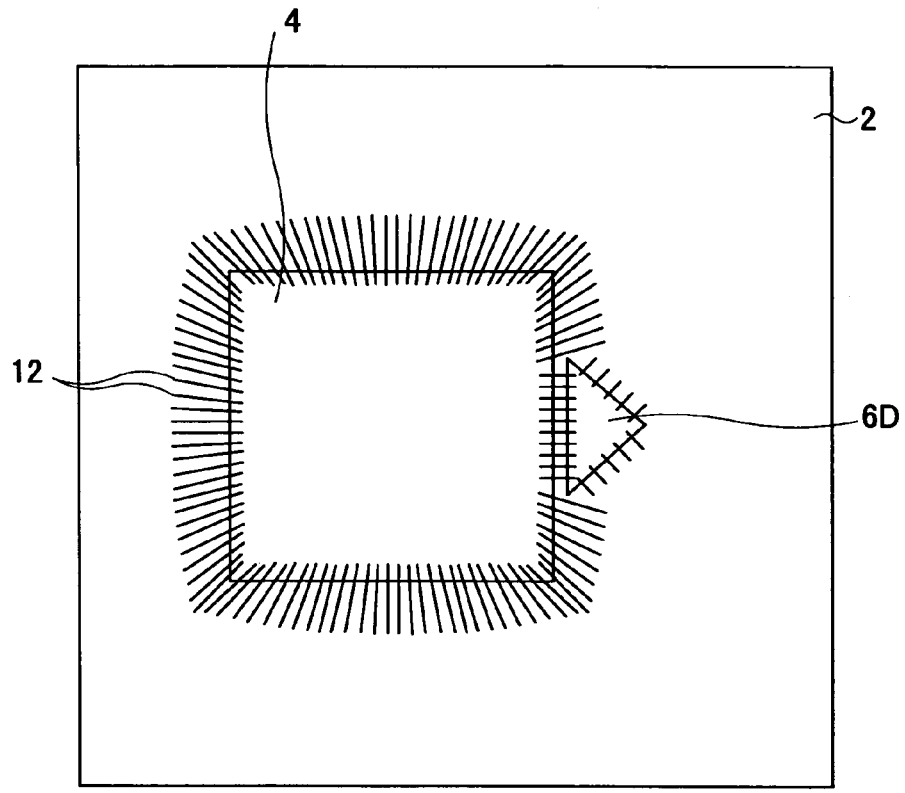
FIG. 9 is a see-through plan view of the semiconductor device shown in FIG. 1.
Figure 10:
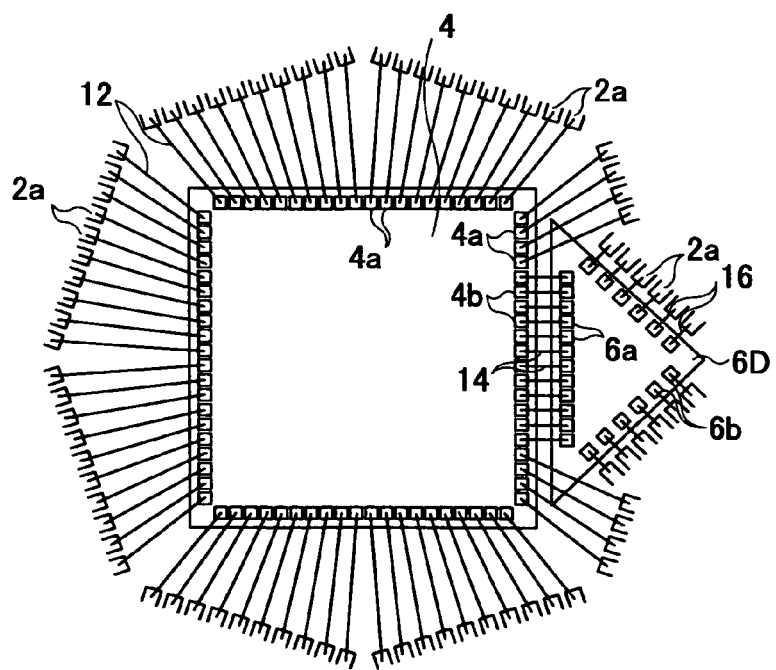
FIG. 10 is a plan view of an interior of the semiconductor device shown in FIG. 9 showing a method of applying bonding wires.

A description will be given, with reference to FIGS. 9 and 10, of a second embodiment of the present invention. FIG. 9 is a see-through plan view of a semiconductor device according to the second embodiment of the present invention. FIG. 10 is a plan view showing a bonding structure in the semiconductor device shown in FIG. 9. It should be noted that, in FIGS. 9 and 10, parts that are the same as the parts shown in FIG. 1 through FIG. 3 are given the same reference numerals, and descriptions thereof will be omitted.

The structure of the semiconductor device according to the second embodiment of the prevent invention is the same as the semiconductor device according to the above-mentioned first embodiment except for an impedance-matched substrate 6D having a triangular shape. That is, as shown in FIG. 9, the semiconductor device according to the second embodiment has a triangular shape of which one side is located close to one side of the semiconductor element 4. In this case, as shown in FIG. 10, the electrodes 6a connected to the electrodes 4b of the semiconductor element are provided along the side facing the semiconductor element 4 of the impedance-matched substrate 6D, and the provides electrodes 6b connected to the electrodes 2a of the substrate 2 are provided along other two sides of the impedance-matched substrate 6D.

By making the impedance-matched substrate into a triangular shape, the bonding-wires 16 extending from the impedance-matched substrate 6D can be stretched in a direction of separating away from the semiconductor element 4. Accordingly, the wiring path in the impedance-matched substrate 6D can be a smooth path, and, a connection to the wiring in the substrate 2 after extending from the impedance-matched substrate 6D can be made smooth.

It should be noted that since the impedance-matched substrate 6D is thinner than the semiconductor element 4 as shown in FIG. 10, the bonding-wires 12 120 that connect electrodes 4a of the semiconductor element 4 to the electrodes 2a of the substrate 2 can be stretched to pass above the impedance-matched substrate 6D. Thereby, a degree of freedom in providing the bonding-wires can be increased, and a degree of freedom in the position of the electrodes 2a of the substrate 2 can also be increase.

Figure 11:
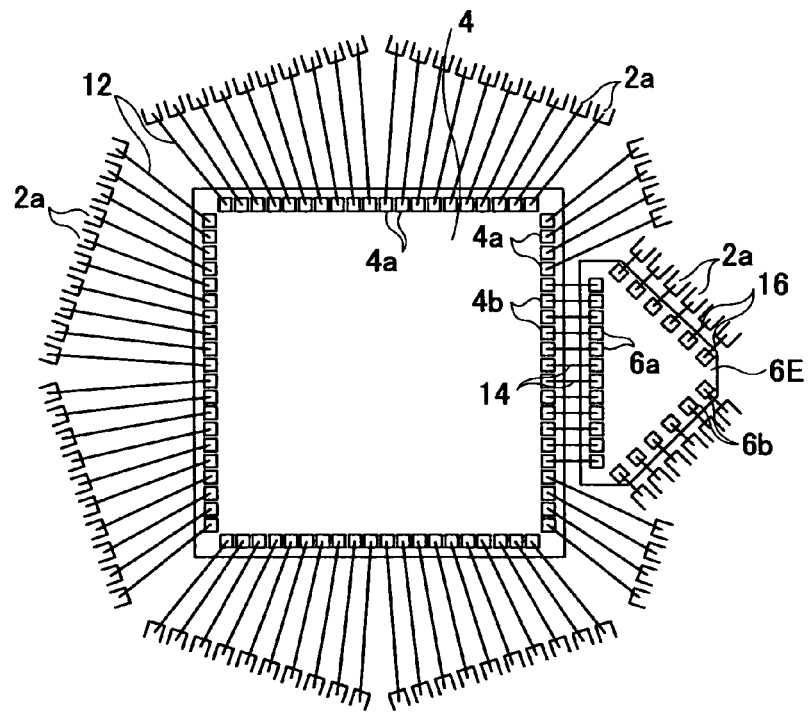
FIG. 11 is a plan view of a variation of the impedance-matching substrate shown in FIG. 10.

FIG. 11 is a plan view of a variation of the impedance-matched substrate 6D shown in FIG. 10. An impedance-matched substrate 6E shown in FIG. 11 has a shape in which corners of a triangle are cut off. When the impedance-matched substrate is made into a triangle as shown in FIG. 10, the portions of the corners of the triangular angle cannot be provided with wiring, which are useless portions. For this reason, the corners of the triangular shape are cut off like the impedance-matched substrate 6E so as to miniaturize the impedance-matched substrate.

As mentioned above, the impedance-matched substrate is not limited to the triangular shape of the quadrangle shape, and may be a polygonal shape or a polygonal shape of which corners are cut off. Moreover, a shape having bowed sides may be used other than shapes having straight sides.

Figure 12:
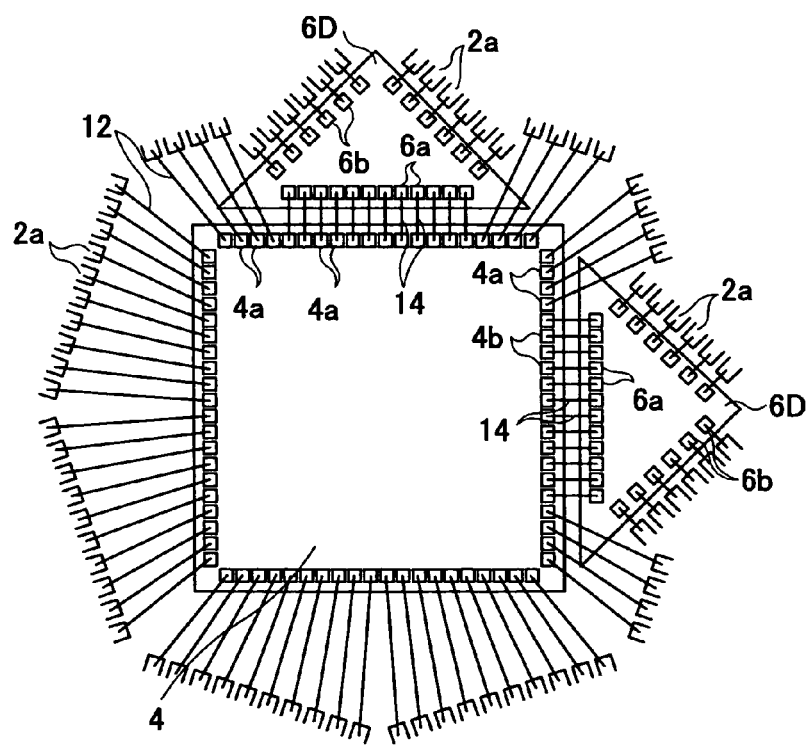
FIG. 12 is a plan view of an interior of a semiconductor device in which two impedance-matching substrates shown in FIG. 10 are provided to one semiconductor element.

FIG. 12 is a plan view shown in an example in which the two impedance-matched substrate 6D shown in FIG. 10 are provided with respect to one semiconductor element 4. When a semiconductor element has many signal lines that require impedance-matching, there may be a case where a single impedance-matched substrate is insufficient. The impedance-matched substrate according to the present invention is not limited to one with respect a single semiconductor element, and a plurality of impedance-matched substrates may be provided with respect to a single semiconductor element.

The present invention is not limited to the specifically disclosed embodiments, and variations and modifications may be made without departing from the scope of the present invention.

The present application is based on Japanese priority application No. 2004-164858 filed Jun. 2, 2004, the entire contents of which are hereby incorporated by reference.

What is claimed is:

1. A semiconductor device comprising:
   a substrate;
   a semiconductor element mounted on the substrate;
   an impedance-matched substrate having wiring that is impedance-matched with circuits of the semiconductor element;
   a plurality of first metal wires connecting between first electrodes of said semiconductor element and electrodes of said substrate;
   a plurality of second metal wires connecting between second electrodes of said semiconductor element and first electrodes of said impedance-matched substrate; and a plurality of third metal wires connecting between second electrodes of said impedance-matched substrate and electrodes of said substrate,
wherein said second metal wires extend parallel to each other, and said third metal wires also extend parallel to each other.

2. The semiconductor device as claimed in claim 1, wherein a pitch of the second electrodes of said impedance-matched substrate is greater than a pitch of the first electrodes of said impedance-matched substrate.

3. The semiconductor device as claimed in claim 1, wherein a pitch of the first electrodes of said impedance-matched substrate is equal to a pitch of the second electrodes of said semiconductor element.

4. The semiconductor device as claimed in claim 1, wherein a distance between adjacent ones of said first metal wires extending from the first electrodes of said semiconductor element to the electrodes of said substrate gradually increases toward the electrodes of said substrate.

5. The semiconductor device as claimed in claim 1, wherein a thickness of said impedance-matched substrate is smaller than a thickness of said semiconductor element.

6. The semiconductor device as claimed in claim 5, wherein a thickness of said impedance-matched substrate is substantially equal to one half of the thickness of said semiconductor element.

7. The semiconductor device as claimed in claim 1, wherein said impedance-matched substrate has a notch at a position where said second electrodes are provided, and said third metal wires are connected to the electrodes of said substrate by extending through an area surrounded by inner surfaces of said notch.

8. The semiconductor device as claimed in claim 7, wherein said impedance-matched substrate is formed of an electrically conductive material, and the inner surfaces of said notch are defined by exposed surfaces of the electrically conductive material.

9. The semiconductor device as claimed in claim 7, wherein the inner surfaces of said notch are plated by an electrically conductive material.

10. The semiconductor device as claimed in claim 1, wherein projection electrodes are formed on the first electrodes of said impedance-matched substrate, and said second metal wires are bonded to the projection electrodes.

11. The semiconductor device as claimed in claim 10, wherein first sides of said second metal wires are bonded to the second electrodes of said semiconductor elements, and second sides of said second metal wires are bonded to said projection electrodes.

12. The semiconductor device as claimed in claim 1, wherein a part of said plurality of first metal wires are connected to said electrodes of said substrate by extending above said impedance-matched substrate.

13. The semiconductor device as claimed in claim 1, shield wirings or shield planes, which are to be at a power supply potential or a grounding potential, are provided on both sides of the impedance-matched wirings of said impedance-matched substrate.

14. The semiconductor device as claimed in claim 13, said impedance-matched substrate is formed of an electrically conductive material, and the shield wirings or the shield planes are formed as a part of said impedance-matched substrate.

15. The semiconductor device as claimed in claim 1, wherein sold impedance-matched substrate has a triangular shape, and a side of the triangular shape is positioned to be adjacent to and parallel to a side of said semiconductor element.

* * * * *